United States Patent
Chang et al.

(10) Patent No.: US 11,382,233 B2
(45) Date of Patent: Jul. 5, 2022

(54) REMOVABLE LEVER FOR INSERTING AND REMOVING A TRAY FROM A CHASSIS MODULE OF A SERVER RACK

(71) Applicant: QUANTA COMPUTER INC., Taoyuan (TW)

(72) Inventors: Chun Chang, Taoyuan (TW); Hsin-Chieh Lin, Taoyuan (TW); Chih-Hao Chang, Taoyuan (TW); You-Lin Tu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/086,011

(22) Filed: Oct. 30, 2020

(65) Prior Publication Data
US 2022/0141985 A1 May 5, 2022

(51) Int. Cl.
*H05K 7/14* (2006.01)

(52) U.S. Cl.
CPC ................ *H05K 7/1489* (2013.01)

(58) Field of Classification Search
CPC .. H05K 7/1489; H05K 7/1404; H05K 7/1409; H05K 5/0221; A47B 2088/4276; G11B 33/128
USPC ........................................... 361/725
See application file for complete search history.

(56) References Cited

U.S. PATENT DOCUMENTS

| | | | | |
|---|---|---|---|---|
| 1,035,483 A | * | 8/1912 | Scott | A45C 13/22 16/406 |
| 5,222,897 A | * | 6/1993 | Collins | H05K 7/1409 361/801 |
| 2004/0077198 A1 | * | 4/2004 | Schlack | H05K 7/1409 439/160 |
| 2005/0190535 A1 | * | 9/2005 | Peng | G06F 1/184 361/679.32 |
| 2006/0221581 A1 | * | 10/2006 | DeNies | H05K 7/1461 361/740 |
| 2007/0002550 A1 | * | 1/2007 | Strmiska | H05K 7/1409 361/798 |
| 2015/0223364 A1 | * | 8/2015 | Mundt | G11B 33/124 174/541 |

* cited by examiner

*Primary Examiner* — Seokjin Kim
*Assistant Examiner* — Gage Crum
(74) *Attorney, Agent, or Firm* — Nixon Peabody LLP

(57) ABSTRACT

A removable lever apparatus for inserting and removing computer equipment from a chassis module of a server rack includes a central rotatable structure, a long arm connected to and extending in a first direction away from the central rotatable structure, and a short arm connected to and extending in a second direction away from the central rotatable structure. The central rotatable structure includes a rotation stopper for limiting rotation about the axis of rotation between an inserting position and a removing position. The central rotatable structure also includes a retention structure for maintaining the coupling to the tray when the central rotatable structure is in a position other than the inserting position. The short arm is configured to engage a side wall of the chassis module when the central rotatable structure is rotated.

11 Claims, 9 Drawing Sheets

REMOVABLE LEVER FOR INSERTING AND REMOVING A TRAY FROM A CHASSIS MODULE OF A SERVER RACK

FIELD OF THE INVENTION

The present invention relates to a removable lever for a computing system. More specifically, the present invention relates to a removable lever for inserting and removing a tray of computer equipment into and from a chassis module of a rack.

BACKGROUND

Rackmounted computing devices, such as rackmounted servers, are employed in large numbers for high demand applications such as network based systems or data centers. Rackmounted equipment can include multiple hardware components that can be swapped out. For example, when upgrading hardware components of a server, such as storage or memory devices, the hardware component can be removed and replaced with higher capacity or higher speed components. Various cards of the server can be replaced with various other cards, etc.

Rackmounted computing devices, such as those found in a server system, can support the swapping of the components. For ease in swapping rackmounted components, there is a need for a computing system that is amenable to accepting and releasing rackmounted equipment on demand, especially at data centers that may be upgrading their hardware. The process of removing and reinstalling the rackmounted equipment can become time consuming for a technician and involve levers with many parts for securing and releasing the rackmounted computing device. In addition, the multi-part levers are also fixed to the rackmounted computing device. Accordingly, the present disclosure is directed to an efficient, space-saving system for removing and installing rackmounted equipment.

SUMMARY

According to one embodiment, a removable lever for inserting and removing computer equipment from a chassis module of a server rack includes a central rotatable structure defining an axis of rotation. The central rotatable structure includes a rotation stopper for limiting rotation about the axis of rotation between an inserting position and a removing position when the central rotatable structure is coupled to a tray of computer equipment. The central rotatable structure also includes a retention structure for maintaining the coupling of the central rotatable structure to the tray when the central rotatable structure is in a position other than the inserting position. The removable lever also includes a long arm connected to and extending in a first direction away from the central rotatable structure, and a short arm connected to and extending in a second direction away from the central rotatable structure. The first direction is different from the second direction. The short arm is configured to engage a side wall of the chassis module when the central rotatable structure is rotated about the axis of rotation.

A further aspect of the embodiment includes a push arm connected to and extending from the central rotatable structure. The push arm is configured to rotate about the axis of rotation. The side wall includes a locking latch member. The push arm engages the locking latch member to push a locking portion of the locking latch member from direct contact with the side wall as the central rotatable structure rotates to the removing position to release the tray of the computer equipment, thereby allowing the tray to be slidingly removed from the chassis module. In another aspect, of the embodiment the long arm has a first length, and the short arm has a second length, such that the ratio of the first length to the second length is greater than about five. In yet another aspect, the long arm and the short arm are parallel and extend in opposite directions from the central rotatable structure. In yet a further aspect, the longitudinal axis of the push arm and the longitudinal axis of the long arm are at an angle between about 120 to about 150 degrees from each other.

In a further aspect of the embodiment, the central rotatable structure includes a pin structure extending perpendicularly along the axis of rotation from a first side of the central rotatable structure. The pin structure includes the rotation stopper and the retention structure. In yet a further aspect, the central rotatable structure includes a second pin structure extending perpendicularly along the axis of rotation from a second opposite side of the central rotatable structure. The second pin structure includes a second rotation stopper and a second retention structure. In a further aspect of the embodiment, the pin structure is configured to engage an aperture in the tray of the computer chassis. The aperture includes a first perimeter cutout for engaging the rotating stopper and a second perimeter cutout for engaging the retention structure. In a further aspect, the pin structure extends through the aperture in the tray to a second aperture in a base of the computer chassis that allows the central rotatable structure to freely rotate during operation of removable lever.

In a further aspect of the embodiment, the central rotatable structure includes an aperture extending therethrough along the axis of rotation. The aperture is configured to engage a first tray pin extending perpendicularly from a first surface of the tray of the computer chassis. The aperture includes the rotation stopper and the retention structure that engage with the first tray pin. In a further aspect, the aperture is configured to engage a second tray pin that is different from the first tray pin. The second tray pin extends perpendicularly from the first surface of the tray of the computer chassis. The rotation stopper and the retention structure are configured to engage with the second tray pin.

In a further aspect of the embodiment, the long arm is unitary and includes two parallel members that are at least partially offset. In yet another aspect, the long arm includes at least one magnet for securing the lever to a ferromagnetic metal surface of the server rack.

According to one embodiment, a method for removing computer equipment with a removable lever from a chassis module of a server rack includes placing a pin structure of the removable lever into a receiving hole of a tray of computer equipment. The removable lever includes a central rotatable structure having a long arm and a short arm connected thereto. A force is applied to the long arm to rotate the removable lever within the receiving hole about an axis of rotation of the central rotating structure. The removable lever is rotated from an initial first position to a second removal position. The rotation is stopped by a rotation stopper protruding from the pin structure abutting a cutout edge of the receiving hole. The short arm outwardly pushes a side wall of the chassis module to release the tray of computer equipment from the chassis module. The tray of computer equipment is pulled out of the chassis module by the long arm of the removable lever. After removing the tray of computer equipment from the chassis module, a force is applied to the long arm. The force rotates the removable lever back to the initial first position such that a retention structure protruding from the pin structure disengages from the receiving hole to allow the removable lever to be lifted out of the receiving hole in a direction of the axis of rotation and to fully disconnect from the tray of computer equipment.

In a further aspect of the embodiment, the outwardly pushing of the side wall includes outwardly pushing a locking latch member that is a part of the side wall with a push arm connected to and extending from the central rotatable structure. The locking latch member initially secures the computer equipment in the chassis module. The outward pushing of the locking latch member by the push arm pushes a locking portion of the locking latch member from direct contact with the side wall to release the tray of computer equipment, thereby allowing the tray to be removed from the chassis module. Another aspect of the embodiment includes the long arm having a first length and the short arm having a second length such that the ratio of the first length to the second length is greater than about five. Yet another aspect includes the long arm and the short arm being parallel and extending in opposite directions from the central rotatable structure. In yet another aspect, the pin structure extends perpendicularly along the axis of rotation from a first side of the central rotatable structure. The pin structure includes the rotation stopper and the retention structure. In yet another aspect, the central rotatable structure includes a second pin structure extending perpendicularly along the axis of rotation from a second opposite side of the central rotatable structure. The second pin structure includes a second rotation stopper and a second retention structure.

According to one embodiment, a method for removing computer equipment with a removable lever from a chassis module of a server rack includes placing an aperture within a central rotatable structure of a removable lever onto a tray pin extending perpendicularly from a first surface of a tray for the computer equipment. The central rotatable structure has a long arm and a short arm connected thereto. A force is applied to the long arm to rotate the removable lever about the tray pin along an axis of rotation from an initial first position to a second removal position. The rotation is stopped by a rotation stopper within the aperture of the central rotatable structure. The short arm outwardly pushes a side wall of the chassis module. The tray of computer equipment is pulled out of the chassis module with the long arm of the removable lever. After removing the tray of the computer equipment from the chassis module, a force is applied to the long arm of the removable lever to rotate the removable lever back to the initial first position, such that a retention structure within the aperture of the central rotatable structure disengages from the tray pin to allow the removable lever to be lifted off the tray pin and fully disconnect from the tray of the computer equipment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

Figure 1A:
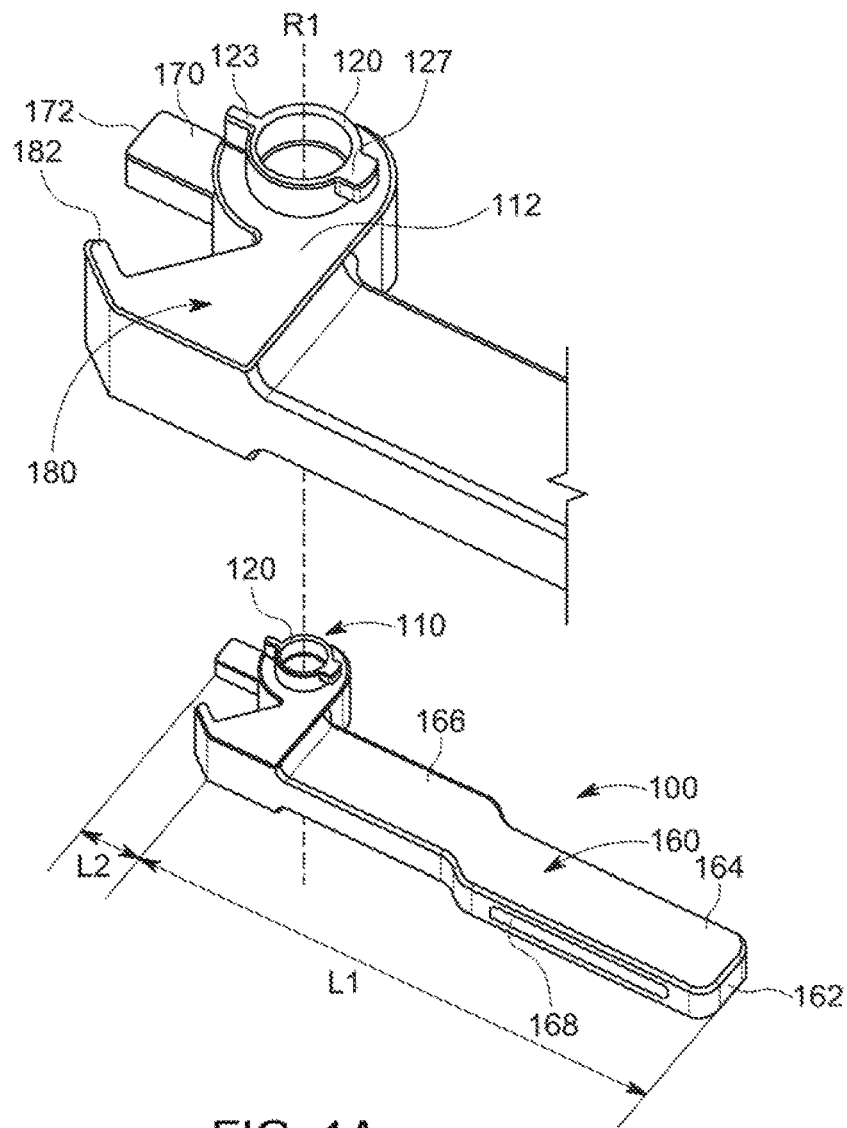
FIG. 1A is a top perspective view of a removable lever for inserting and removing computer equipment into and from a chassis module, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" refer to any electronically-powered or battery-powered equipment that has hardware, software, and/or firmware components, where the software and/or firmware components can be configured for operating features on the device.

Space-saving systems that further provide for the efficient removal and installation of rackmounted equipment are contemplated by the present disclosure. A desirable implementation includes a removable lever configured to engage an aperture, such as a receiving hole, in a tray for computer equipment where the removable lever is rotatable about the receiving hole to provide for the removal of the tray from a chassis module of a server rack. Another desirable implementation of a removable lever for inserting or removing a tray of computer equipment from a rack can include the removable lever as a unitary or monolithic part (i.e., a single piece) that minimizes any assembly that would otherwise be associated with fixing a lever to a tray. Yet a further desirable implementation of a removable lever can include a configuration that minimize that amount of space taken up by a lever in the input/output regions at the front of a computing system.

Figure 1B:
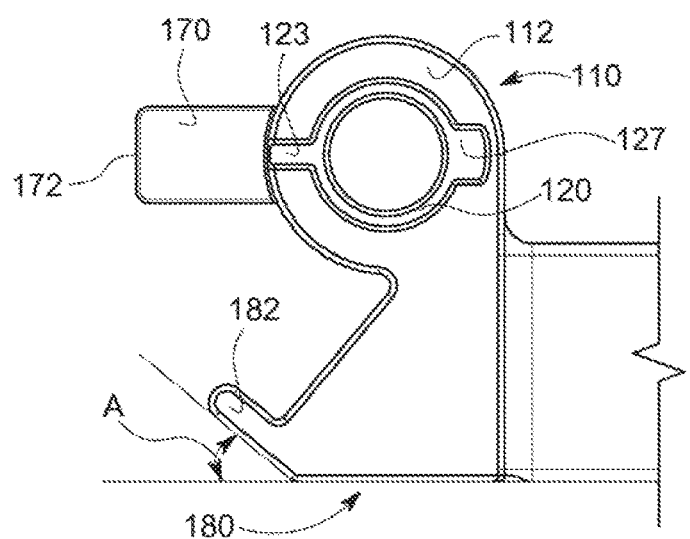
FIG. 1B is a top view of a portion of the removable lever of FIG. 1A, according to some implementations of the present disclosure.

Turning now to FIGS. 1A and 1B, a top perspective view is depicted (in FIG. 1A) of a removable lever 100 for inserting and removing computer equipment from a chassis module, and a top view is depicted (in FIG. 1B) of a portion of the removable lever 100. The removable lever 100 includes a central rotatable structure 110 defining an axis of rotation R1 for the removable lever 100. The central rotatable structure 110 includes a rotation stopper 123 that limits the rotation about the axis of rotation R1 between an initial inserting position and a tray removing position when the central rotatable structure is coupled to a receiving hole of a tray for computer equipment, as illustrated, for example, by receiving hole 230 and tray 240 in FIGS. 2,3A-3B, and 5A-5B. The central rotatable structure 110 also includes a retention structure 127 for maintaining the coupling of the central rotatable structure 110 to the receiving hole (e.g., element 230 in FIGS. 2, 3A, and 3B) of the tray (e.g., element 240 in FIGS. 2, 3A, and 3B) when the central rotatable structure 110 is in a position other than an initial inserting position.

In some implementations, the central rotatable structure 110 includes a pin structure 120 extending perpendicularly along the axis of rotation R1 from a first side 112 of the central rotatable structure 110. The pin structure 120 may in some aspects includes the rotation stopper 123 and the retention structure 127.

Figures 5A, 5B:
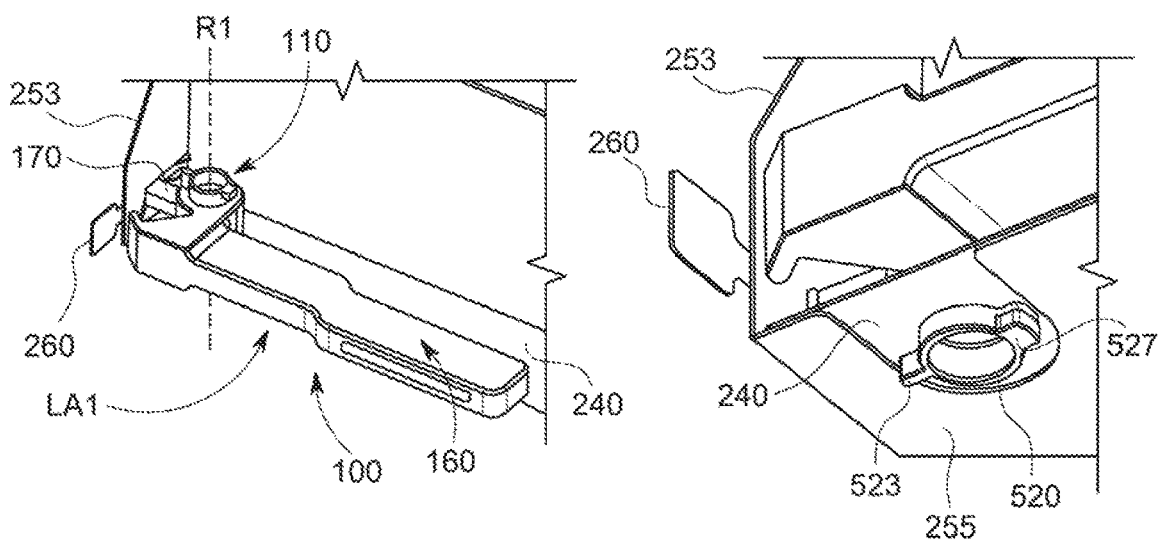
FIGS. 5A and 5B are top and bottom perspective views of the removable lever of FIG. 2 with the removable lever in a position for inserting the tray of computer equipment into the computer chassis, according to some implementations of the present disclosure.

In some implementations, a single removable lever 100 can be used separately in receiving holes on opposing front sides of a tray. For example, it is contemplated that the central rotatable structure 110 may include two pin structures, such as first pin structure 120 extending perpendicularly along the axis of rotation R1 from the first side 112 and a second pin structure (e.g., pin structure 520 in FIG. 5B) extending perpendicularly from a second side opposite the first side 112 of the central rotatable structure 110. The second pin structure 520 can also include a second rotation stopper 523 (FIG. 5B) and a second retention structure 527 (FIG. 5B).

The removable lever 100 includes a long arm 160 connected to and extending in a first direction away from the central rotatable structure 110. The removable lever 100 also includes a short arm connected to and extending in a second direction away from the central rotatable structure 110. The direction of the extension of the long arm 160 away from the central rotatable structure 110 is different from the direction of the extension of the short arm 170. In some aspects, the long arm 160 and the short arm 170 extend away from the central rotatable structure in opposite directions, where the longitudinal axes of the long arm 160 and short arm 170 are generally parallel to each other. In other aspects, the long arm 160 and short arm 170 may extend away from the central rotatable structure 110 along planes that are generally parallel or non-parallel to each other, or in such a way that intersecting extensions of the longitudinal axis of the long arm 160 and the longitudinal axis of the short arm 170 are skew.

In some implementations, the removable lever 100 includes a push arm 180 connected to and extending from the central rotatable structure 110. Similar to the long arm 160 and the short arm 170, the push arm 180 is configured to rotate about the axis of rotation R1. The push arm 180 may include a protruding extension 182 for engaging a side wall (e.g., side wall 253 in FIG. 2) of a computer chassis.

It is contemplated that in some implementations the long arm 160, short arm 170, and the push arm 180 may comprise a unitary, continuous structure (i.e., a single piece) with the central rotatable structure 110. Similarly, other features of the removable lever 100, such as pin structures 120, 520, rotation stoppers 123, 523, and retention structures 127, 527 may also be part of the same unitary, continuous structure (i.e., one piece) with the central rotatable structure 110.

The long arm 160 has a first length, L1, as measured from the axis of rotation R1 to the far end 162. Similarly, the short arm 170 has a second length, L2, as measured from the axis of rotation R1 to the far end 172. The length, L2, of short arm 170 can vary, and in one aspect of the present disclosure, L2 is between about 25 mm to about 60 mm in length. In some implementations, the ratio of L1 to L2 is greater than five such that the length L1 is at least five times greater than the length L2. In some implementations, the ratio of L1 to L2 is approximately five. While a ratio of about five or greater is desirable, it is contemplated that in some aspects the ratio may be smaller, such as between four and five.

In some implementations, the long arm 160 is fabricated as a unitary or monolithic part (i.e., one piece) with two members 164, 166 that are parallel and at least partially offset at approximately the mid-point of the long arm 160. In some aspects, the long arm 160 includes at least one magnet 168 for securing the removable lever 100 between uses to a ferromagnetic metal surface, such as on a server rack.

Figure 2:
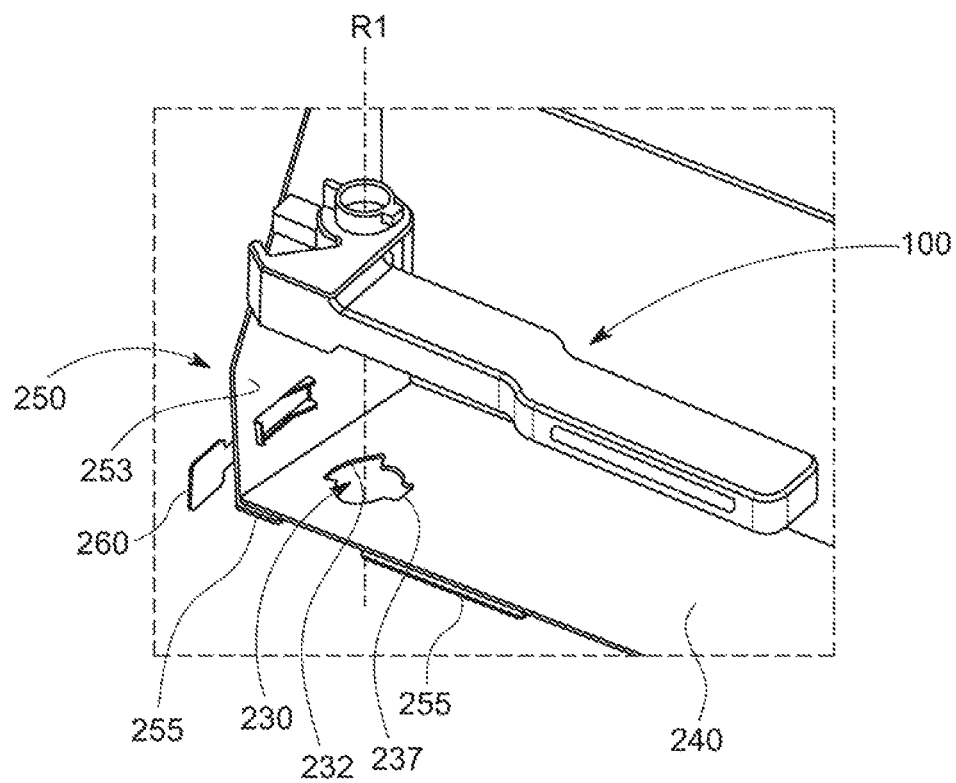
FIG. 2 is a partially exploded top perspective view of the removable lever of FIG. 1A that includes a tray with a receiving hole and a chassis module, according to some implementations of the present disclosure.

Turning now to FIG. 2, a partially exploded perspective view is depicted of the removable lever 100, a tray 240 with a receiving hole 230, and a chassis module 250. The tray 240 is for computer equipment (e.g., computer equipment 1145 in FIGS. 11A to 11C) that is inserted into and removed from the chassis module 250 via the tray 240. The chassis module 250 is depicted with a base 255 and side wall(s) 253 extending upwardly from the left and right side of the base 255. A locking latch member 260 is also depicted that is connected to and a part of the side wall 253.

In some implementations, the removable lever 100 is inserted into an aperture (e.g., receiving hole 230) of the tray 240 to couple the removable lever 100 and tray 240. The coupling of the tray 240 and the removable lever 100 provides for the removal of the tray 240 from a chassis module 250. The chassis module 250 can be part of a server rack or other rack with chassis modules for holding trays of computer equipment. It is also contemplated that the removable lever 100 can be inserted into the receiving hole 230 to allow the removable lever 100 to be used to insert the tray 240 into the chassis module 250. The removable lever 100 can be removed from the receiving hole 230 and used for other purposes, such as inserting or removing other trays from a rack or for storage between uses by securing the removable lever 100 to the rack, such as via a magnet 168 or other securing mechanism connected to the removable lever 100.

Figure 3A:
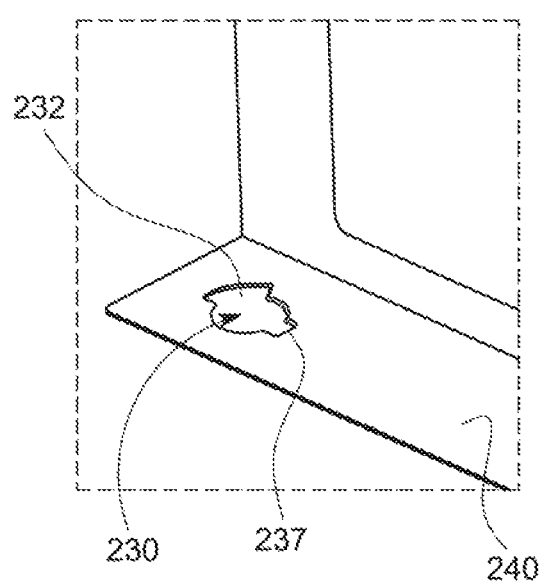
FIGS. 3A and 3B are a top perspective view and a top view of a portion of the tray in FIG. 2, according to some implementations of the present disclosure.
Figure 3B:
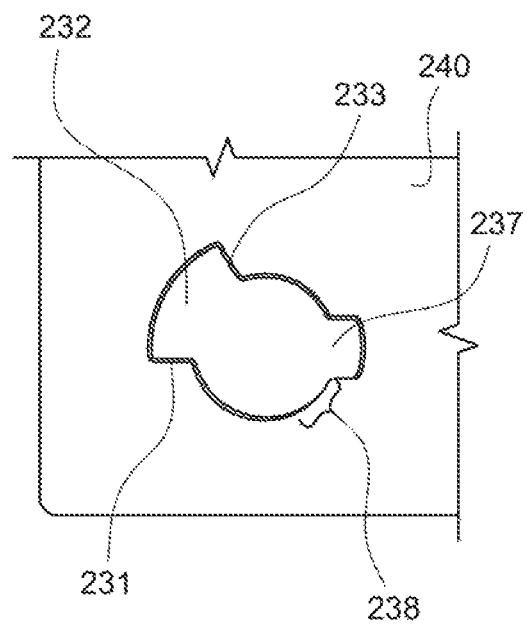

Referring to FIGS. 3A and 3B, a top perspective view (FIG. 3A) and a top view (FIG. 3B) are depicted of a portion of the tray 240 including an aperture exemplified by the receiving hole 230. As depicted, for example, in FIGS. 5A and 5B, a pin structure, such as pin structure 520, engages with the receiving hole 230 depicted in FIGS. 3A and 3B. The pin structure 520 (FIG. 5B) is inserted into the receiving hole 230. The receiving hole 230 defines a first perimeter cutout 232 that engages a rotating stoppering 523 (FIG. 5B) and a second perimeter cutout 237 that engages with a retention structure 527 (FIG. 58).

The coupling of the removable lever 100 (FIG. 2) with the receiving hole 230 allows the removable lever 100 to rotate within the receiving hole 230 about the axis of rotation R1. When the removable lever 100 is first inserted into the receiving hole 230, this is considered to be in an inserting position where the removable lever 100 can also be removed or disengaged from the tray 240. In the inserting position, the rotating stopper, such as element 123 (FIGS. 1A and 1B) or 523, is positioned at first cutout edge 231. The removable lever 100 is rotated about the axis of rotation R1 to a second position, also referred to as a removing position (i.e., where the removable lever 100 is used to remove the tray), to a second cutout edge 233. The first perimeter cutout 232, between the first cutout edge 231 and the second cutout edge 233, defines the range of rotation of the removable lever 100 in the receiving hole 230 about the axis of rotation R1. Similarly, in the inserting position, the retention structure, such as element 527 in FIG. 5B, of the removable lever 100 is positioned in the second perimeter cutout 237. Once the removable lever 100 is rotated about the axis of rotation, R1, toward the second position, also referred to as a removing position (i.e., where the removable lever 100 is used to remove the tray), a tray portion 238 adjacent the second perimeter cutout 237 is positioned between the retention structure 527 and a bottom side of the central rotating structure 110. This positioning of the retention structure 527 keeps the removable lever 100 coupled to the receiving hole and otherwise prevents the removable lever 100 from being removed from the receiving hole 230 until the removable lever 100 is rotated about the axis of rotation R1 back to the original inserting position. The removable lever 100 can either remain in the original inserting position, or it can be removed from the receiving hole 230 of the tray.

Figure 4A:
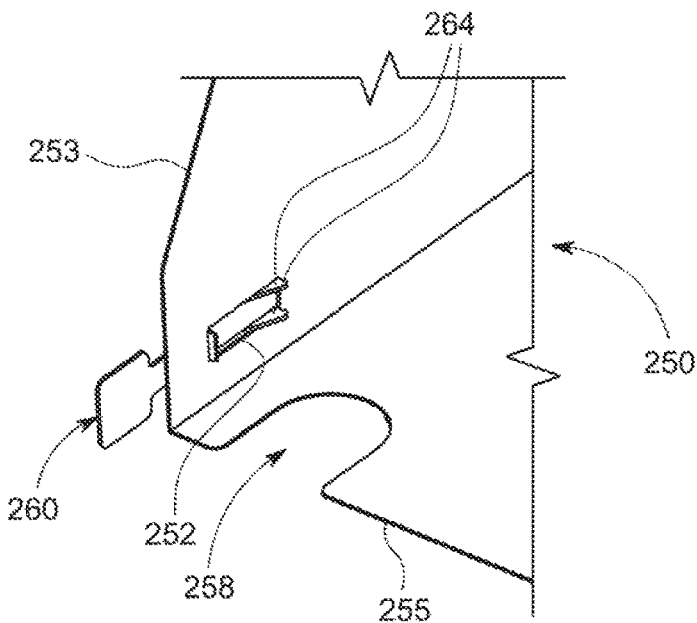
FIG. 4A is a top perspective view of a portion of the chassis module in FIG. 2 that includes a locking latch member, according to some implementations of the present disclosure.

Referring to FIG. 4A, a top perspective view is depicted of a portion of the chassis module 250 including a locking latch member 260 fixed to aside wall 253. The base 255 of the chassis module 250 also includes a base aperture 258 that allow a pin structure (e.g., element 527 in FIG. 5B) extending from the central rotatable aperture 110 to be inserted into the receiving hole 230 (see FIGS. 2 and 3A) of the tray and allow the central rotatable structure 110 to freely rotate during operation of removable lever 100. For example, FIG. 5B depicts a pin structure 520 extending from a central rotatable structure of a removable lever 100 through a receiving hole (e.g., element 230 in FIGS. 3A and 3B) of tray 240 and through the base aperture 258 of the base 255 of the chassis module 250.

In some implementations, the locking latch member 260 may be fabricated from a flexible metal. The locking latch member 260 may be fixed (e.g., rivet 266 in FIG. 4C), or otherwise mechanically secured, to the side wall 253 of the chassis module 250 such that the locking latch member 260 is cantilevered so that the locking latch member 280 can bend away for the side wall 253. In some implementations, the side wall 253 further includes a side wall aperture 252 that allows one or more locking protrusions 264 extending from the locking latch member 260 to penetrate the side wall 253 and engage the tray 240 (FIG. 2).

Figures 4B, 4C:
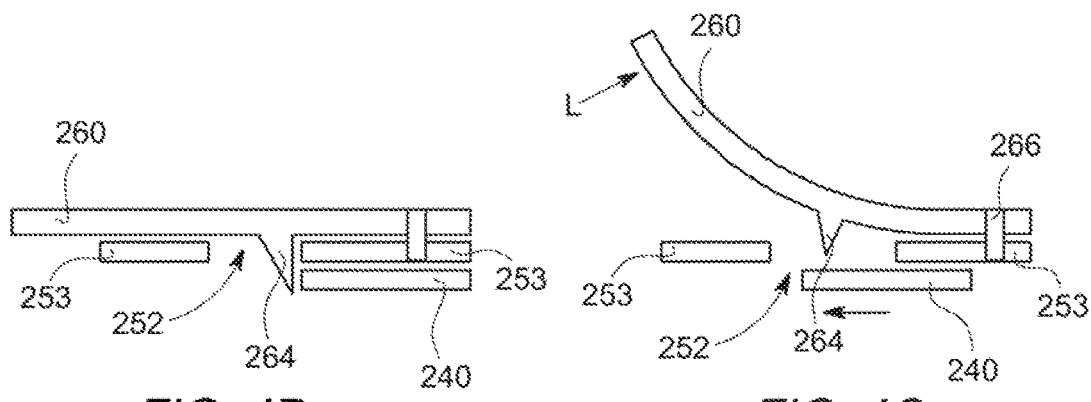
FIGS. 4B and 4C are schematic diagrams of a horizontal cross-section through a side wall of the chassis module in FIG. 2, according to some implementations of the present disclosure.

Referring to FIGS. 4B and 4C, schematic top view cross-sectional diagrams are depicted of through the side wall 253 of the chassis module 250 (FIG. 4A) that include the locking latch member 260 in a first position in FIG. 4B securing a tray 240 of computer equipment and a second position in FIG. 4C allowing removal of the tray 240 of computer equipment. When the tray 240 is secured by the locking latch member 260 in the first position, the one or more locking protrusions 264 extend through the side wall aperture 252 to prevent the tray 240 from sliding relative to the side wall 253. Conversely, when the tray 240 is not secured, the locking latch member 260 is in the second position with the locking latch member 260 bent at the unsecured end in direction L away from side wall 253, such that the one or more locking protrusions 264 no longer prevent the tray 240 from sliding relative to the side wall 253.

Turning now to FIGS. 5A and 5B, top and bottom perspective views are depicted of a removable lever 100 inserted into the receiving hole of the tray 240. The removable lever 100 is positioned with a pin structure 520 extending from a central rotatable structure 110 of a removable lever 100 through a receiving hole (occupied by pin structure 520) of tray 240 and through the base aperture 258 (FIG. 4A) of the base 255 of the chassis module 250 (FIG. 4A). The short arm 170 extending from the central rotatable structure 110 engages the side wall 253 of the chassis module 250 (FIG. 4A). As the long arm 160 of the removable lever 100 is pushed or rotated in direction LA1, the tray 240 for computer equipment is inserted into the chassis module 250 until the tray 240 is secured by the locking latch member 260.

Figure 6A:
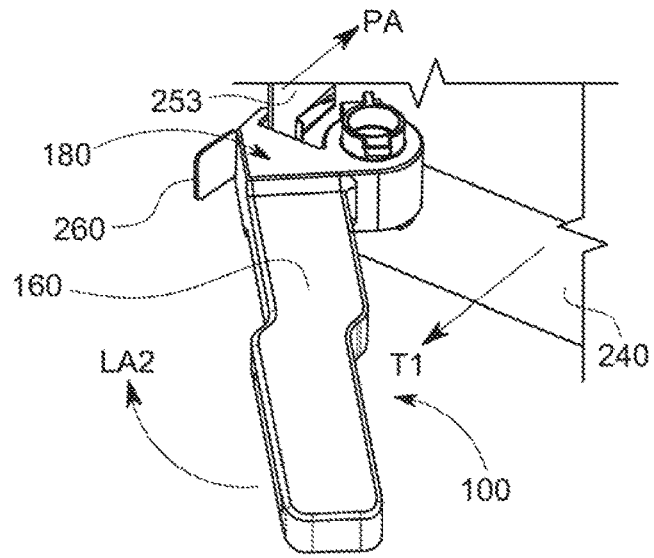
FIGS. 6A and 6B are top perspective views of the removable lever of FIG. 2 with the removable lever in a position for removing the tray of computer equipment from the computer chassis, according to some implementations of the present disclosure.
Figure 6B:
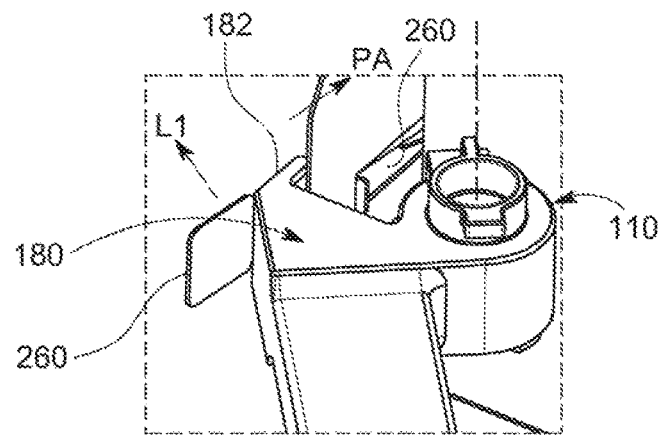

Turning now to FIGS. 6A and 6B, top perspective views are depicted of a removable lever 100 positioned for removing the tray 240 from the chassis module. As the long arm 160 is rotated in direction LA2 about the axis of rotation R1, in some implementations a push arm 180 connected to the central rotatable structure 110 also rotates in the same direction. The removable lever 100 continues to rotate until the rotation stopper 523 (see FIG. 5B) contacts cutout side edge 233 of the receiving hole 230 and can no longer rotate in direction LA2. At this point, the push arm 180 including protruding extension 182, has engaged the locking latch member 160 and pushed the unsecured cantilevered end away from side wall 253. Furthermore, the protruding extension 182 of push arm 180 is wedged along direction PA between the locking latch member 160 and the side wall 253. By pushing the unsecured cantilevered end away from side wall 253, the locking protrusion 264 (see FIGS. 4B and 4C) is no longer in a locking position such that the tray 240, along with any computer equipment disposed on the tray 240, can be removed in direction T1 out of the chassis module 250 (see FIGS. 4A and 6E). At this point, the removable lever 100 is in the removing position for removing the tray 240. In some implementations, the longitudinal axis of the protruding extension 182 of push arm 180 is at an angle A (see FIG. 1B) from the longitudinal axis of the long arm 160, where angle A is between about 120 to about 150 degrees.

In some implementations, a method for removing a tray of computer equipment from a chassis module 250 of a server rack includes the step of placing a pin structure, such as 120 (FIGS. 1A and 1B) or 520 (FIG. 5B) of a removable lever 100, into a receiving hole 230 (FIGS. 2 and 3A) of a tray 240 for computer equipment. As depicted, for example, in FIGS. 6A and 6B, the next step includes applying a force in direction LA2 to the long arm 160 (FIG. to rotate the removable lever 100 within the receiving hole 230 about an axis of rotation R1 of the central rotating structure 110. The removable lever 100 is rotated from an initial first position to a second removal position. The rotation of the removable lever 100 is stopped by a rotation stopper, such as 123 (FIGS. 1A and 1B) or 523 (FIG. 5B), protruding from the central rotatable structure 110 that abuts a cutoff side edge 233 (FIG. 3B) of the receiving hole 230 (FIGS. 2 and 6E). In some implementations, the short arm 170 (FIG. 6C) is outwardly pushing a side wall 253 of the chassis module 250 (FIGS. 2 and 4A). In some implementations, the tray 240 of the computer equipment is pulled out of the chassis module 250 by the long arm 160. After removing the computer equipment from the chassis module 250, an opposite force can be applied to the long arm 160 to rotate the removable lever 100 back to the initial first position where a retention structure that protrudes from the central rotatable structure 110, such as elements 127 or 527 in FIG. 1A or 5B, disengages from the receiving hole 230. The disengagement from the receiving hole allows the removable lever 100 to be lifted out of the receiving hole 230 in a direction of the axis of rotation R1 and fully disconnect from the tray 240 of the computer equipment.

In some implementations, the outward pushing of the side wall 253 includes outwardly pushing a locking latch member 260 that is connected to the side wall 253 using the push arm 180 connected to and extending from the central rotatable structure 110. The locking latch member 260 initially secures the tray 240 with the computer equipment in the chassis module 250. The outward pushing of the locking latch member 260 by the push arm 180 releases a locking element, such a locking protrusion 264 (FIGS. 4B and 4C) of the locking latch member 260 from direct contact with the side wall 253. This allows the tray 240 of computer equipment to be removed from the chassis module 250.

Figure 6C:
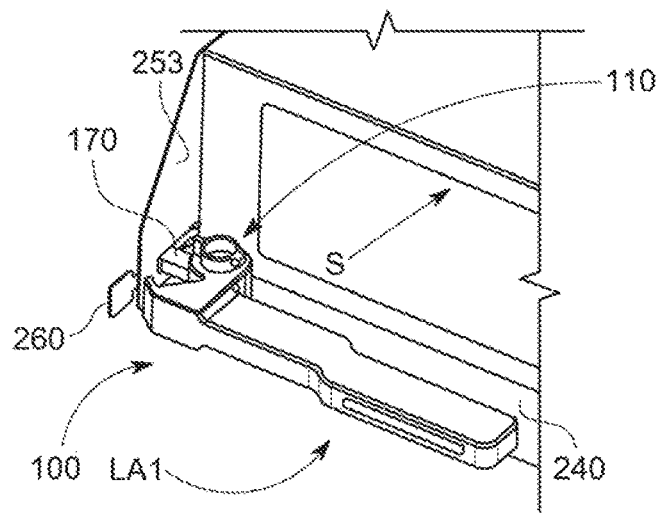
FIGS. 6C to 6E are top perspective views of the removable lever of FIG. 2 with the removable lever in a position for insetting or removing the removable lever from the receiving hole in the tray, according to some implementations of the present disclosure.
Figure 6D:
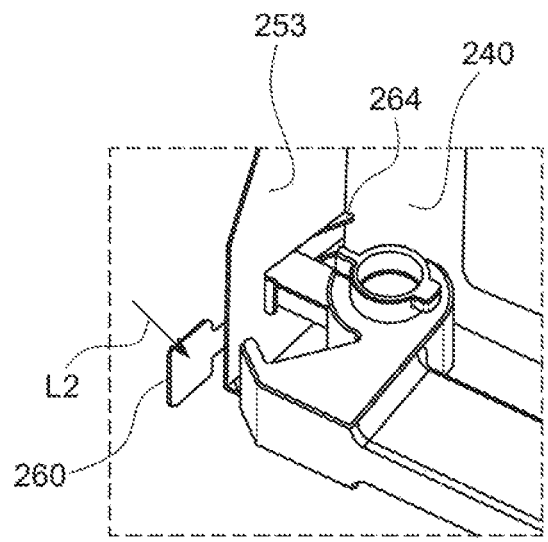
Figure 6E:
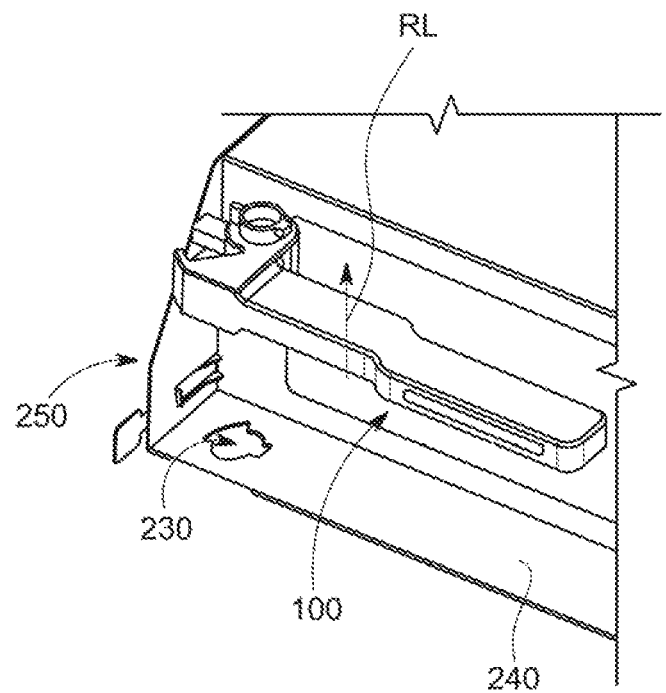

Referring now to FIGS. 6C to 6E, top perspective views are depicted of the removable lever 100 in a position for inserting the tray 240 into the chassis module 250, and removing the removable lever 100 from the receiving hole 230 in the tray 240. Referring to FIGS. 6C and 6D, the removable lever 100 is rotated about the axis of rotation of the central rotatable structure 110 in direction LA1. As the removable lever 100 is push in direction LA1, the tray 240 engages the locking latch member 260 that is connected to the side wall 253 of the chassis module 250 that secures the tray 240 to the chassis module 250 (FIG. 6E). As the tray 240 slides past locking protrusions 264 into the chassis module 250, the locking latch member 260 moves in direction L2 and fully secures the tray 240 once the tray 240 slides past locking protrusions 264 of the locking latch member 260. Referring to FIG. 6E, once the tray 240 is secured in the chassis module 250, the removable lever 100 can be removed from receiving hole 230 when the removable lever 100 is in the position as depicted in FIGS. 6C and 6D such that the retention structure, such as elements 127 (FIGS. 1A and 1B) or 527 (FIG. 5B), allow the removable lever 100 to be raised in direction RL and lifted out of the receiving hole 230.

Figure 7:
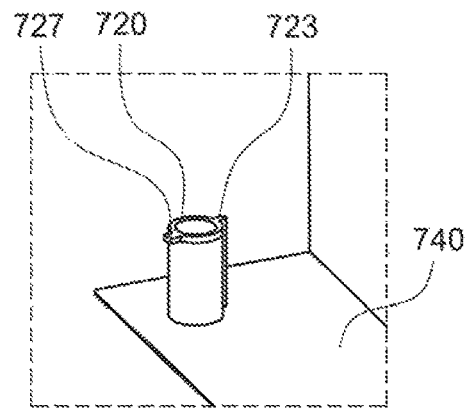
FIG. 7 is a perspective view of a portion of a tray including a tray pin for engaging a removable lever, according to some implementations of the present disclosure.

Turning now to FIG. 7, a perspective view is depicted of a portion of a tray 740 including a tray pin 720 extending upwardly from the surface of the tray 740. The tray pin 720 allows the tray 740 to engage with a removable lever 800 depicted in FIGS. 8 and 9. The tray pin 720 includes a pin stopper 723 and a pin retainer 727 for engaging with a rotation stopper 832 cutout (see FIG. 8) and a retention structure 837 cutout (see FIG. 8) in the aperture 830 (see FIG. 8) of the removable lever 800.

Figure 8:
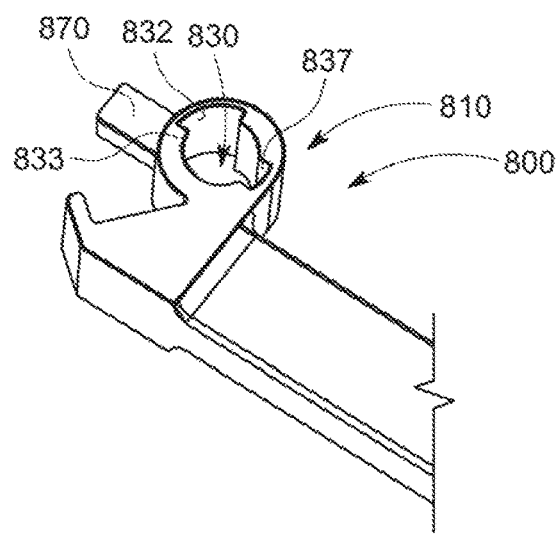
FIG. 8 is a perspective view of a portion of a removable lever configured to engage a tray of computer equipment using the tray pin of FIG. 7, according to some implementations of the present disclosure.

Referring to FIG. 8, a perspective view is depicted of a portion of the removable lever 800 configured to engage a tray 740 (FIG. 7) of computer equipment via the tray pin 720 (FIG. 7). The removable lever 800 includes a central rotatable structure 810 having an aperture 830 extending therethrough along an axis of rotation R2 (see FIG. 9) that is also the longitudinal axis of the tray pin 720. The aperture 830 is shaped to engage a first tray pin 720 extending perpendicularly from a first surface of the tray 740 of the computer chassis. The aperture 830 including the rotation stopper 832 and the retention structure 837 that engage with the pin stopper 723 and pin retainer 727 of the first tray pin 720. The aperture 830 includes a first cutout that defines the rotation stopper 832 and a second cutout that define the retention structure for receiving the pin stopper 723 and pin retainer 727.

In some implementations, the aperture 830 of the removable lever 800 can engage a second tray pin (not shown) that is different from but similar to the first tray pin 720. Similar to first tray pin 720, the second tray pin extends perpendicularly from a top surface of the tray 740 but on an opposing front side. The primary difference in the operation of the same removable lever 800 relative to the first tray pin and the second tray pin is that the removable lever 800 is just flipped to its other side. The rotation stopper 823 and retention structure 827 of the aperture 830 similarly engage a pin stopper and a pin retainer of the second tray pin as the aperture 830 is inserted onto, rotates about, and is removed from the tray pin 720.

Figure 9:
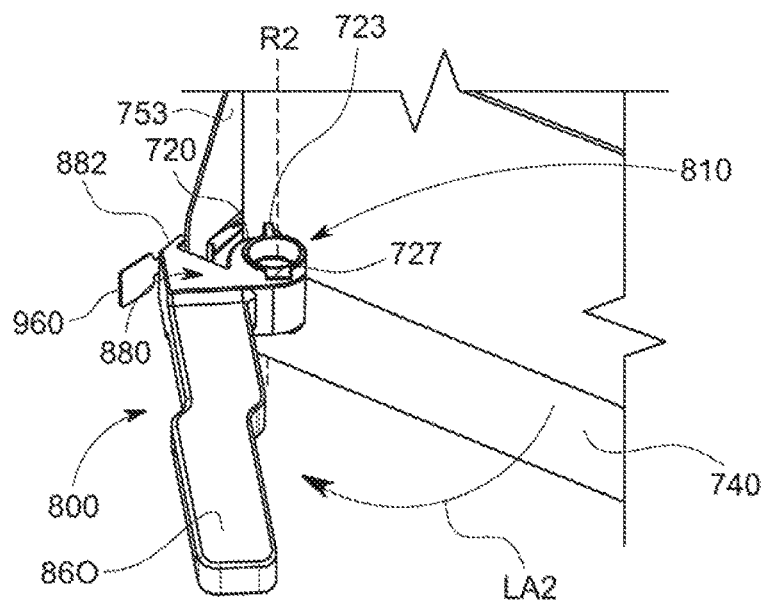
FIG. 9 is a top perspective view of the removable lever of FIG. 8 with the removable lever in a position for removing the tray of computer equipment from the computer chassis, according to some implementations of the present disclosure.

Referring now to FIG. 9, a top perspective view is depicted of the removable lever 800 of FIG. 8 in a position for removing the tray 740 of computer equipment from the computer chassis. FIG. 8 is similar to FIG. 6A with the primary difference that the removable lever 800 engages the tray 740 via an aperture 830 engaging with the tray pin 720 depicted in FIG. 7, rather than via a pin structure that extends from a removable lever, such as removable lever 100, that is inserted into a receiving hole in a tray. A long arm 860 is depicted being rotated in direction LA2 about an axis of rotation R2. In some implementations, a push arm 880 connected to a central rotatable structure 810 that also rotates in the same direction LA2. The removable lever 800 continues to rotate until an edge 833 of the rotation stopper 823 contacts the pin stopper 723 (see FIG. 7) of the aperture 830 and can no longer rotate in direction LA2. At this point, the push arm 880, including a protruding extension 882, has engaged a locking latch member 860 and pushed an unsecured cantilevered end of the locking latch member 960 away from a side wall 753. Furthermore, the protruding extension 882 of push arm 880 is similarly wedged between the locking latch member 960 and the side wall 753. By pushing the unsecured cantilevered end away from side wall 753, the tray 740, along with any computer equipment disposed on the tray 740, can be removed (e.g., via sliding) in a direction out of a chassis module of a rack.

In some implementations, a method for removing computer equipment with a removable lever 800 from a chassis module of a server rack includes the step of placing an aperture 830 dispose within a central rotatable structure 810 of a removable lever 800 into a tray pin 720 that extends perpendicularly from a first surface of a tray 740. Next, a force is applied to the long arm 860 in direction LA2 to rotate the removable lever 800 about the tray pin 720 along an axis of rotation R2 from an initial first position to a second removal position, as depicted in FIG. 9. The rotation is stopped by the rotation stopper 823 when the pin stopper 723 makes contact with edge 833. In some implementations, a short arm outwardly pushes a side wall 753 of the chassis module. Next, the tray 740 of computer equipment is pulled out of the chassis module with the long arm 860 of the removable lever 800. After removing the tray 740 of computer equipment from the chassis module, a force is applied in the opposite direction of LA2 to the long arm 860. The force rotates the removable lever 800 back to the initial first position such that the pin retainer 727 on the tray pin disengages from the retention structure 837 of the aperture 830 to allow the removable lever 800 to be lifted off the tray pin 720 and fully disconnect from the tray 740.

Figure 10:
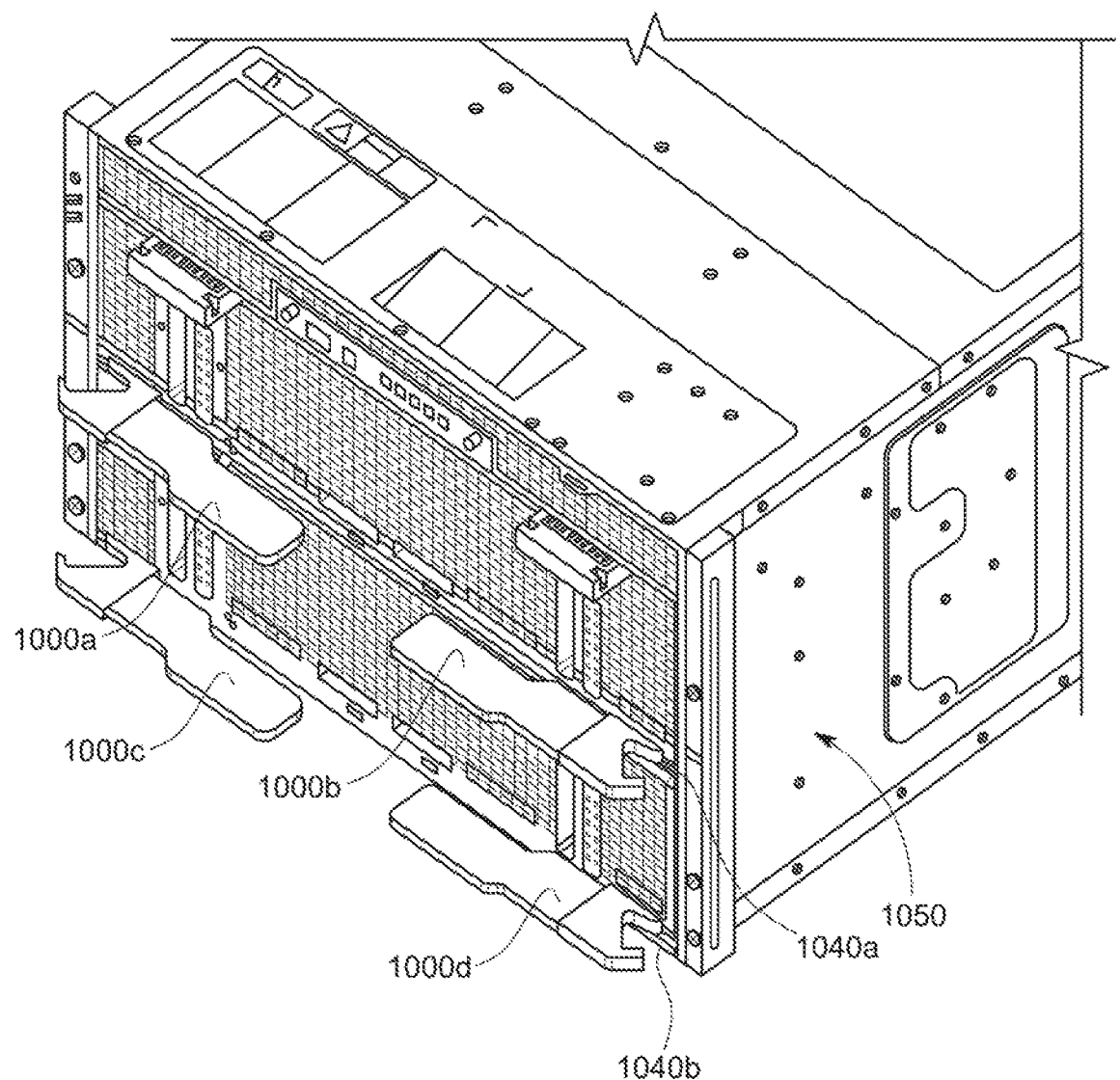
FIG. 10 is a top perspective view of one or more removable levers for stacked trays of computer equipment in chassis modules of a server rack, according to some implementations of the present disclosure.

Turning now to FIG. 10, a top perspective view is depicted of one or more removable levers 1000a, 1000b, 1000c, 1000d for stacked trays 1040a, 1040b of computer equipment in chassis modules 1050 of a server rack. More or fewer stacked trays are contemplated based on the desired capacity of the server rack. Similarly, more or fewer removable levers are contemplated. For example, in some implementations, a server rack may have two removable levers to service the entire rack such that a removable lever can be positioned on the opposing sides of a tray, such as removable levers 1000a, 1000b for tray 1040a. The removable levers 1000a, 1000b can then be disengaged from tray 1040a once the tray 1040a is positioned as desired. The removed removable levers 1000a, 1000b can then be positioned to engage with the next tray, such as tray 1040b, and so on, until all the trays in a server rack are positioned as desired.

Figure 11A:
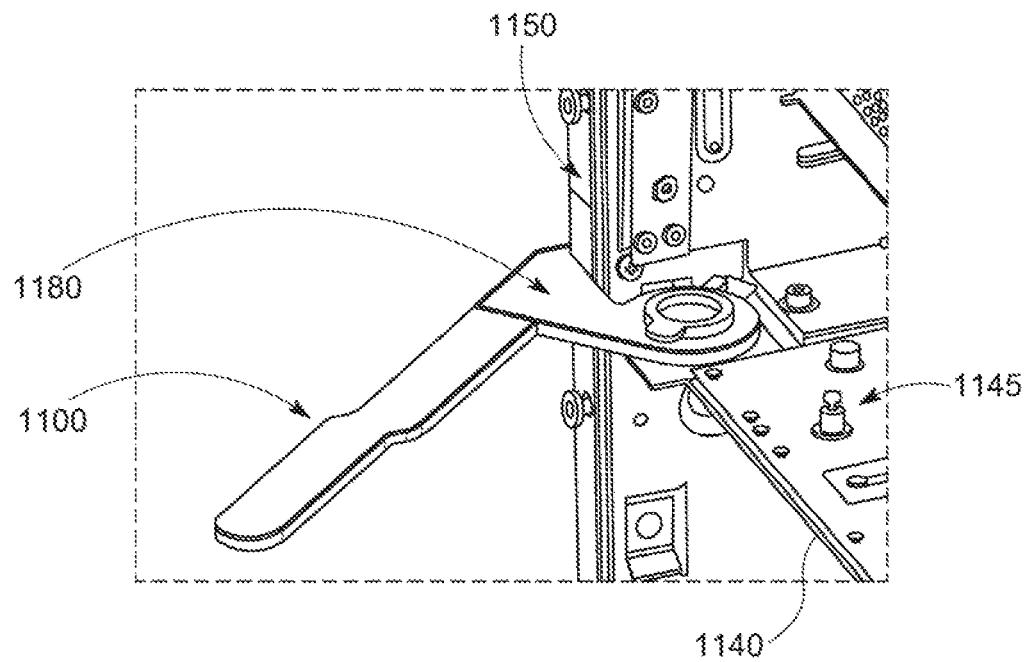
FIGS. 11A to 11C are perspective views of a removable lever in multiple positions relative to a receiving hole for a tray of computer equipment, according to some implementations of the present disclosure.
Figure 11B:
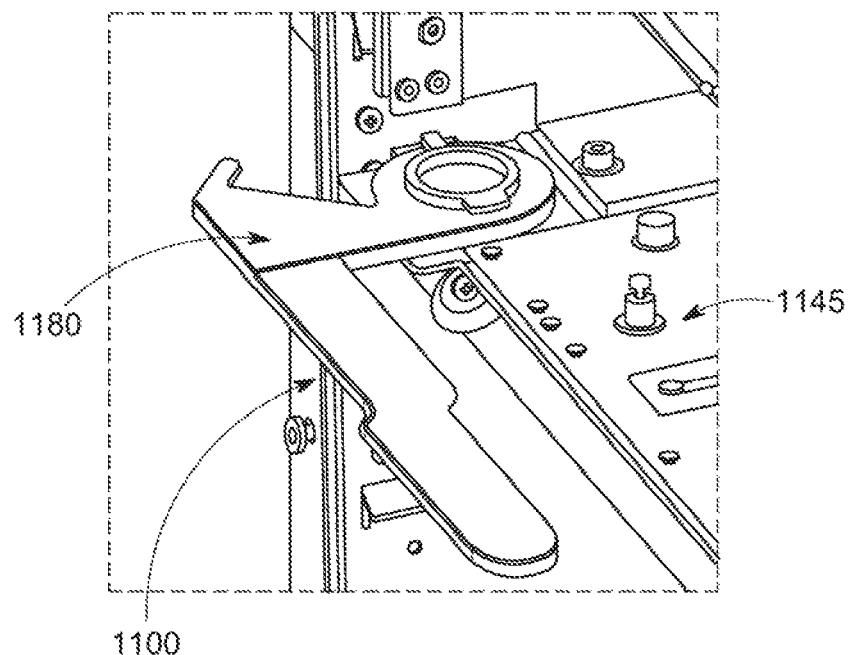
Figure 11C:
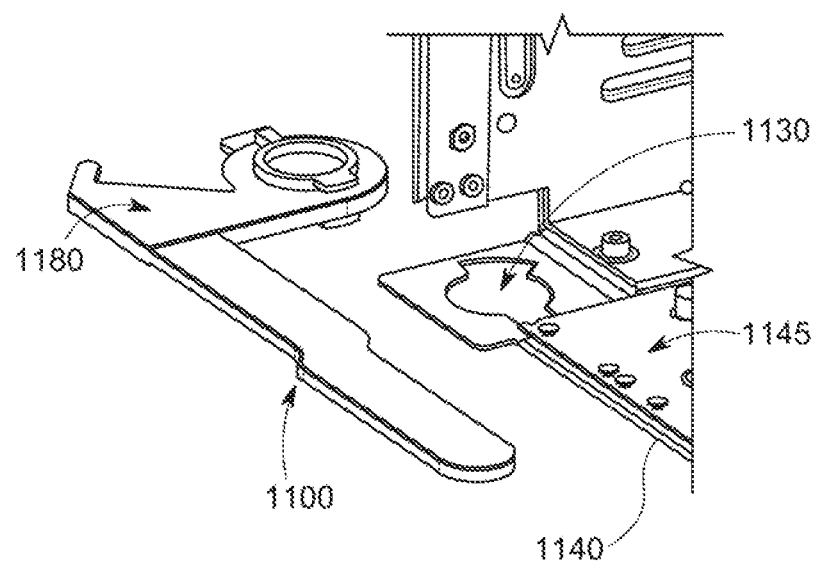

Turning now to FIGS. 11A to 11C, perspective views are depicted of a removable lever 1100, similar to removable levers 1000a to 1000d in FIG. 10, in multiple positions relative to a receiving hole 1130 for a tray 1140 of computer equipment 1145. The removable lever 1100 is a low-profile removable lever that is otherwise similar to one or more of the features of removable levers 100 and 800, or can be modified to include the features of removable levers 100 or 800.

Referring to FIG. 11A, the removable lever 1100 is rotated clockwise about a receiving hole 1130 of the tray 1140 to a point where a push arm 1180 abuts a chassis module 1150 holding the tray 1140. With the push arm 1180 of the removable lever 1100 positioned as depicted in FIG. 11A, the tray 1140 is unlocked from a locking latch member, such as the locking latch member 260 described in FIGS. 4A to 4C. The tray 240 is allowed to be slid out of the chassis module 1150. In some implementations, the removable lever 1100 may be used on an opposite side of the tray that mirrors the depiction in FIG. 11A, including a second receiving hole where rotating the removable lever 1110 counterclockwise allows the tray 1140 being pulled out of the chassis module 1150.

Referring to FIG. 11B, the removable lever 1100 has been rotated about the receiving hole 1130 to an initial position when the removable lever 1100 was initially inserted into the receiving hole 1130 (see FIG. 11C) just prior to being rotated clockwise as depicted in FIG. 11A. In the initial position illustrated in FIG. 11B, the removable lever 1100 can be used to push a tray 1140 of computer equipment 1145 into a chassis module 1150. With the removable lever 1100 in the initial position, the removable lever 1100 can also be removed from the receiving hole of the tray 1140 as depicted in FIG. 11C, and stored (e.g., magnetically secured to a server rack) until next needed or used for repositioning another tray.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A removable lever for inserting and removing computer equipment from a chassis module of a server rack, the removable lever comprising:
   a central rotatable structure defining an axis of rotation, the central rotatable structure including (i) a rotation stopper for limiting rotation about the axis of rotation between an inserting position and a removing position when the central rotatable structure is coupled to a tray of computer equipment, and (ii) a retention structure for maintaining the coupling of the central rotatable structure to the tray when the central rotatable structure is in a position other than the inserting position;
   a long arm connected to and extending in a first direction away from the central rotatable structure; and
   a short arm connected to and extending in a second direction away from the central rotatable structure, the first direction being different from the second direction, the short arm configured to engage a side wall of the chassis module when the central rotatable structure is rotated about the axis of rotation,
   wherein the central rotatable structure further includes a first pin structure extending perpendicularly along the axis of rotation from a first side of the central rotatable structure, the first pin structure including the rotation stopper and the retention structure, and
   wherein the central rotatable structure further includes a second pin structure extending perpendicularly along the axis of rotation from a second opposite side of the central rotatable structure, the second pin structure including a second rotation stopper and a second retention structure.

2. The removable lever of claim 1, further comprising a push arm connected to and extending from the central rotatable structure, the push arm configured to rotate about the axis of rotation, wherein the side wall includes a locking latch member such that the push arm engages the locking latch member to push a locking portion of the locking latch member from direct contact with the side wall as the central rotatable structure rotates to the removing position and release the tray of computer equipment, thereby allowing the tray to be slidingly removed from the chassis module.

3. The removable lever of claim 1, wherein the long arm has a first length and the short arm has a second length such that the ratio of the first length to the second length is greater than about five.

4. The removable lever of claim 1, wherein the long arm and the short arm are parallel and extend in opposite directions from the central rotatable structure.

5. The removable lever of claim 2, wherein the longitudinal axis of the push arm and the longitudinal axis of the long arm are at an angle between about 120 to about 150 degrees from each other.

6. The removable lever of claim 1, wherein the first pin structure is configured to engage an aperture in the tray of the computer chassis, the aperture including a first perimeter cutout for engaging the rotating stopper and a second perimeter cutout for engaging the retention structure.

7. The removable lever of claim 6, wherein the first pin structure extends through the aperture in the tray to a second aperture in a base of the computer chassis, the second aperture allowing the central rotatable structure to freely rotate during operation of removable lever.

8. The removable lever of claim 1, wherein the central rotatable structure includes an aperture extending therethrough along the axis of rotation, the aperture configured to engage a first tray pin extending perpendicularly from a first surface of the tray of the computer chassis, the aperture including the rotation stopper and the retention structure that engage with the first tray pin.

9. The removable lever of claim 8, wherein the aperture is configured to engage a second tray pin that is different from the first tray pin, the second tray pin extending perpendicularly from the first surface of the tray of the computer chassis, the rotation stopper and the retention structure configured to engage with the second tray pin.

10. The removable lever of claim 1, wherein the long arm is unitary with two parallel members that are at least partially offset.

11. The removable lever of claim 1, wherein the long arm includes at least one magnet for securing the lever to a ferromagnetic metal surface of the server rack.

* * * * *